US006867446B2

(12) United States Patent
Otani et al.

(10) Patent No.: US 6,867,446 B2
(45) Date of Patent: Mar. 15, 2005

(54) SEMICONDUCTOR MEMORY DEVICE

(75) Inventors: Miharu Otani, Yokohama (JP); Jun Tanaka, Kawasaki (JP); Kazufumi Suenaga, Yokohama (JP); Kiyoshi Ogata, Kawasaki (JP)

(73) Assignee: Renesas Technology Corp., Tokyo (JP)

( * ) Notice: Subject to any disclaimer, the term of this patent is extended or adjusted under 35 U.S.C. 154(b) by 170 days.

(21) Appl. No.: 10/268,709

(22) Filed: Oct. 11, 2002

(65) Prior Publication Data

US 2003/0071293 A1 Apr. 17, 2003

(30) Foreign Application Priority Data

Oct. 15, 2001 (JP) ........................................ 2001-316825
Sep. 17, 2002 (JP) ........................................ 2002-269371

(51) Int. Cl.[7] ............................................ H01L 31/062
(52) U.S. Cl. ................................ 257/295; 257/E27.104
(58) Field of Search ........................ 257/295, E27.104, 257/300, 298, 304

(56) References Cited

U.S. PATENT DOCUMENTS 5,976,928 A * 11/1999 Kirlin et al. ................. 438/240

FOREIGN PATENT DOCUMENTS

| JP | 7-273297 | 10/1995 |
| JP | 11-126883 | 5/1999 |
| JP | 2000-164817 | 6/2000 |

* cited by examiner

*Primary Examiner*—David Nelms
*Assistant Examiner*—Tu-Tu Ho
(74) *Attorney, Agent, or Firm*—Mattingly, Stanger & Malur, P.C.

(57) ABSTRACT

In a semiconductor memory device having a capacitor layer comprising a dielectric film or a ferroelectric film, as an interlayer insulation film formed between the capacitor and a wiring layer formed at the upper part thereof or an insulation film which covers the wiring layer, a multilayered film is used which consists of a first insulation film and a second insulation film laid upon the other; the former being a lower layer and being formed of an organic film, and the latter being an upper layer and being formed of a hard-mask material. This makes it possible to prevent thin film comprised of a dielectric material or a ferroelectric material from any deterioration caused by the hydrogen and water contained in the interlayer insulation film and passivation film of the semiconductor memory device and also by the stress of these films.

7 Claims, 9 Drawing Sheets

(NUMBER OF MOLECULES PER 1 g OF SAMPLE CONTAINING WAFER; INTEGRAL VALUE AT 100°C TO 600°C)

MEMORY AREA    LOGIC AREA

MEMORY AREA    LOGIC AREA

MEMORY AREA      LOGIC AREA

MEMORY AREA      LOGIC AREA

MEMORY AREA          LOGIC AREA

SEMICONDUCTOR MEMORY DEVICE

BACKGROUND OF THE INVENTION

1. Field of the Invention

This invention relates to a semiconductor memory device and a manufacturing process for the same. More particularly, this invention relates to a non-volatile or large-capacitance semiconductor memory device in which a thin film of a dielectric material having a high dielectric constant or of a ferroelectricmaterial is used as a capacitive insulation film, and a manufacturing process for the same.

2. Description of the Related Art

Ferroelectric films have features such as self polarization and high dielectric constant characteristics, and the ferroelectric films have hysteresis characteristics between polarization and electric fields of ferroelectric substances. Accordingly, as non-volatile memories, semiconductor devices making use of ferroelectric films are on research and development. Also, the ferroelectric films have much larger dielectric constant than silicon oxide films so that memory cells can be made to have smaller area when the ferroelectric films are used as capacity insulation films. Hence, they can be used as large-capacitance highly integrated RAMs (random access memories).

Semiconductor devices making use of ferroelectric films are commonly made up by forming a capacitor layer of the ferroelectric film usually on an MOS transistor and thereafter further forming a top wiring layer, an insulation layer and a passivation layer.

The ferroelectric films are comprised of a sintered body of a metal oxide, and contain oxygen which is rich in reactivity. Conventional semiconductor memory devices in which capacitors are formed by using such ferroelectric films in the capacity insulation films are so constructed that noble-metal electrodes which are stable to oxidation reaction, as exemplified by those chiefly composed of platinum, are formed in the upper and lower electrodes of the capacity insulation films to form the capacitors. Then, after the capacitors have been formed, interlayer insulation films and devices are formed, and thereafter passivation films are formed on the outermost surfaces of the devices.

As structures concerning the above ferroelectric films, proposals are disclosed in Japanese Patent Applications Laid-open No. 7-273297, No. 11-126883, No. 2000-164817 and so forth.

In the above conventional semiconductor memory devices, silicon nitride or silicon oxide is used as the interlayer insulation films and passivation films. Such interlayer insulation films and passivation films are usually formed by CVD (chemical vapor deposition) and hence hydrogen generated from material gases is often incorporated in the films. Also, the silicon nitride can prevent water from entering, but does not have any barrier properties against the hydrogen.

Meanwhile, ferroelectric films are known to undergo deterioration of polarization characteristics upon their annealing in an atmosphere of hydrogen. This deterioration is presumed to be caused by the platinum of upper and lower electrodes which reacts with hydrogen to act as a reducing catalyst to reduce the ferroelectric film.

Although the ferroelectric films have the characteristic of being reduced with ease, the above conventional semiconductor memory devices make use of materials which contain hydrogen, in the interlayer insulation films and passivation films of the devices. Hence, they have a problem of causing deterioration of electrical properties of ferroelectric devices.

It is also known that the ferroelectric films have piezoelectric properties and hence are used in piezoelectric devices. Such films are susceptible to inner stress of the devices. This also is a factor to cause deterioration of electrical properties of ferroelectric devices. Accordingly, it is important that the interlayer insulation films and passivation films used in semiconductor memory devices are formed using materials which do not contain any hydrogen and are films made to have less stress.

SUMMARY OF THE INVENTION

On the basis of the foregoing consideration, an object of the present invention is, in a semiconductor memory device having a capacitive insulation film in which a dielectric material having a high dielectric constant or a ferroelectric material is used, to prevent the film of the dielectric material having a high dielectric constant or of the ferroelectric material from any deterioration caused by the hydrogen and water contained in the interlayer insulation film and passivation film of the device and by the stress of these films, to provide a semiconductor memory device having a high reliability, and a process for forming the same.

According to the present invention, the above object is achieved by a semiconductor memory device having a capacitor in which a thin film of a dielectric material having a high dielectric constant or of a ferroelectric material is used as a capacitive insulation film, wherein;

i) an interlayer insulation film formed between the capacitor and a wiring layer formed at the upper part thereof or ii) an insulation film which covers the wiring layer comprises a multilayered film consisting of a first insulation film and a second insulation film laid upon the other; the former being a lower layer and being formed of an organic film, and the latter being an upper layer and being formed of a hard-mask material.

The above hard-mask material forms a film having high hydrogen barrier properties to chemically prevent hydrogen from entering the thin film of a dielectric material having a high dielectric constant or of a ferroelectric material. This hard-mask material contains at least one of $TiO_2$, $SiO_2$, $Al_2O_3$, $Or_2$, $TiN$, $Ta_2O_5$, lead titanate zirconate, barium strontium titanate, niobium strontium bismuth tantalate, $SrBi_2Ta_2O_9$, $ZrO_2$, $ZrSiO_4$, $HfO_2$, $Y_2O_3$, $BaTiO_3$, $La_2O_3$, $Gd_2O_3$ and $PrO_2$, and physically or chemically prevents hydrogen from entering the ferroelectric film.

The semiconductor memory device according to the present invention is a device in which the thin film of a dielectric material having a high dielectric constant or of a ferroelectric material is used as the capacitive insulation film, and is preferably applicable in non-volatile semiconductor memories and large-capacitance DRAMs.

As a material for the above capacitive insulation film, any of lead titanate zirconate [$Pb(Zr,Ti)O_3$; abbreviation: PZT], barium strontium titanate [$(Ba,Sr)Ti)O_3$; abbreviation: BST], niobium strontium bismuth tantalate [$SrBi_2(Nb,Ta)_2O_9$; abbreviation: Y1 system], $SrBi_2Ta_2O_9$, $Ta_2O_5$ and so forth may be used. These materials are formed into films by well known chemical vapor deposition (CVD), sol-gel processing, sputtering or the like.

In the present invention, the multilayered film in which the first insulation film formed of an organic film is provided as a lower layer and the second insulation film formed of a hard-mask material is provided as an upper layer may be used as a passivation film which covers the whole device, including insulation films and wiring layers which are formed after capacitor films have been formed, at the upper part of the capacitor films.

The organic film is more hydrophobic than inorganic materials. Hence, it may less absorb water and also can be formed at a lower temperature or can be made to have a low internal stress. Moreover, it can be formed by coating, and hence does not undergo any plasma damage against the capacitive insulation film which may be caused when interlayer films are formed by conventional plasma-assisted CVD.

In the present invention, a material like oxide material having a high reactivity with hydrogen is used as the hard-mask material to form a film, and hence this film is reduced to absorb hydrogen, whereby the hydrogen reaching the capacitor can be controlled to a low level.

On account of these features, the ferroelectric film can be made less deteriorate by heat, less deteriorate by stress, less deteriorate by the reduction due to hydrogen and water and less undergo plasma damage, and the performance as a packaged product can be maintained over a long period of time.

BRIEF DESCRIPTION OF THE DRAWINGS

These and other features, objects and advantages of the present invention will become more apparent from the following description when taken in conjunction with the accompanying drawings wherein.

DESCRIPTION OF THE PREFERRED EMBODIMENTS

Embodiments of the present invention are described below.

Figure 1:
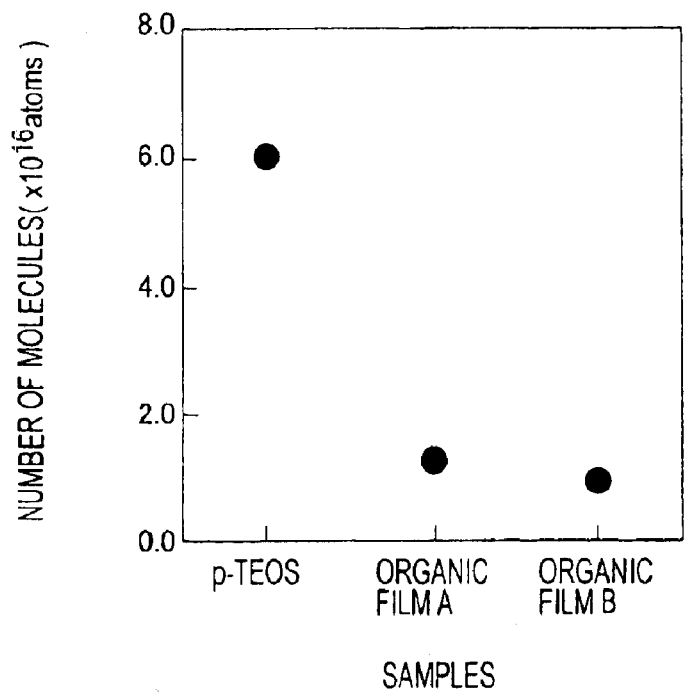
FIG. 1 shows the quantity of water desorption from insulation films.

The adsorption (quantity) of water to an organic film and an inorganic film is described first. The desorption (quantity) of water from an organic film A of a polyarylene type and from an organic film B of a polyarylene ether type is shown in FIG. 1. The number of water molecules per 1 g of each sample containing a wafer is plotted as ordinate. For comparison, the desorption of water from a p-TEOS film, which is a commonly available inorganic insulation film, is also shown together. To determine the desorption of water, a programmed-temperature desorbed gas analyzer is used, and a bare silicon wafer on which each film has been formed is cut in a size of 1 cm×1 cm, and thereafter is heated from room temperature to 600° C. at a rate of 1° C./second, where the quantity of a component of m/z=18 generated during the heating is measured.

To form the polyarylene organic film A, a precursor solution therefor was coated on the silicon wafer by means of a spinner, a well known means, followed by heat treatment subsequently on hot plates of 180° C. and 320° C. for 1 minute each, and further followed by heat curing in a 400° C. furnace for 30 minutes in a stream of nitrogen. Here, the film was in a layer thickness of 400 nm.

To form the polyarylene ether organic film B, a precursor solution therefor was spin-coated on the silicon wafer, followed by heat treatment subsequently on hot plates of 150° C., 200° C. and 250° C. for 1 minute each, and the coating thus formed was heat-cured in a 400° C. furnace for 30 minutes in an atmosphere of nitrogen. Here, the film was in a layer thickness of 400 nm.

The p-TEOS film used as a comparative example was formed from TEOS (tetraethyl orthosilicate) plasma by plasma-assisted CVD. Here, the film was formed at a temperature of 450° C., and in a layer thickness of 400 nm.

As the result, as shown in FIG. 1, the organic film adsorbs the water in a quantity of as small as ⅙ or less, compared with the inorganic film, and is seen to be more able than the inorganic film to restrain the ferroelectric film from the deterioration due to the water contained in the insulation film.

Embodiments of the semiconductor memory device and manufacturing process according to the present invention are described below in detail with reference to the drawings.

Figure 2:
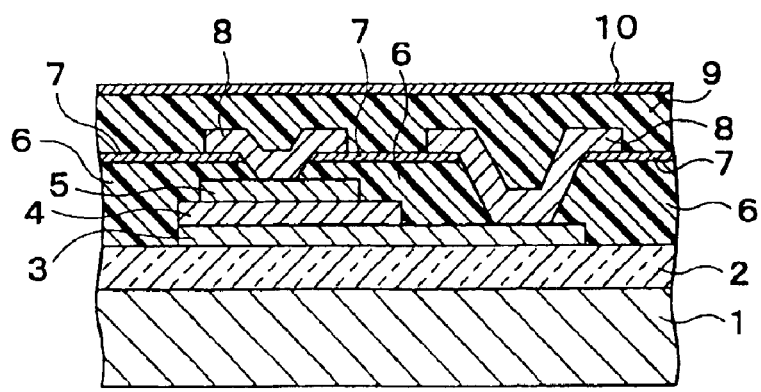
FIG. 2 is a sectional view for describing an example of the construction of a semiconductor memory device according to an embodiment of the present invention.

FIG. 2 is a sectional view for describing an example of the construction of a semiconductor memory device according to an embodiment of the present invention. In FIG. 2, reference numeral 1 denotes a semiconductor substrate; 2, an interlayer insulation film; 3, a lower electrode; 4, a capacitive insulation film (ferroelectric layer); 5, an upper electrode; 6, a first insulation film; 7, a second insulation film; 8, a top wiring layer; 9, a first surface-protective film; and 10, a second surface-protective film. The semiconductor memory device according to an embodiment of the present invention, described below, takes the case of a non-volatile ferroelectric semiconductor memory device.

The memory device shown in FIG. 2 is formed in the following way: On the interlayer insulation film 2 at the upper part of the semiconductor substrate 1, on which transistors (not shown) have been fabricated, a capacitor is formed which consists of the lower electrode 3, the capacitive insulation film (ferroelectric layer) 4 and the upper electrode 5. Thereafter, a multilayered film consisting of the first insulation film 6 and the second insulation film 7, formed of the organic film and a hard-mask material, respectively, is so formed as to cover the capacitor. Thereafter, openings are formed in these insulation films 6 and 7, and the top wiring layer 8 is formed. Then, the memory device is protected with a multilayered film consisting of the first surface-protective film 9 and the second surface-protective film 10, formed of the organic film and a hard-mask material, respectively, which film covers the whole memory region.

In the foregoing, the multilayered film consisting of the first insulation film 6 and the second insulation film 7 constitutes an interlayer insulation film. Also, the multilayered film consisting of the first surface-protective film 9 and the second surface-protective film 10 is an insulation film which covers the wiring layer. Then, the first insulation film 6 and the first surface-protective film 9 are both insulation films comprised of an organic material. Also, the second insulation film 7 and the second surface-protective film 10 are both insulation films comprised of a hard-maskmaterial, and are present at least at an memory area (memory cell region) shown in FIG. 8.

The organic films (i.e., films containing an organic matter) serving as the first insulation film 6 and first surface-protective film 9 used in the semiconductor memory device according to an embodiment of the present invention, having the structure as described above, may preferably be formed of a polyimide, a polyarylene, a polyarylene ether, or benzocyclobutene.

Any of these materials may be coated on the semiconductor device by a means such as rotary coating making use of a spinner, or by dipping or printing. The layer thickness of the film formed by coating may be regulated by changing the solid-matter concentration, viscosity or the like of a coating method or coating solution. Also, these materials have a high heat resistance, and hence the film may less deteriorate even when the semiconductor processing is carried out at a high temperature.

These organic materials can also stably achieve a relative dielectric constant of less than 4.0. Hence, even when a hard-mask material (inorganic material) having a large relative dielectric constant is used as the second insulation film, the relative dielectric constant as the whole multilayered film can be kept not larger than the relative dielectric constant (4.0 or more) of inorganic insulation films used conventionally. This can prevent signal transmission time from greatly delaying because the multilayered insulation film comes to have a large relative dielectric constant. Needless to say, from the viewpoint of signal transmission delay time characteristics, it is not advisable that the material has a relative dielectric constant of 4.0 or more.

In addition, these organic materials have a film stress of approximately tens of MPa. On the other hand, inorganic insulation films formed by conventional CVD have a film stress of hundreds of MPa. More specifically, the use of the organic film makes it possible to keep to $\frac{1}{10}$ or less any stress load which accompanies the stacking, compared with any conventional stacked structure. Moreover, since the organic materials have a low film-forming temperature and hence may provide a small heat load, the heat stress can also be lessened. Hence, any deterioration due to the stress of the semiconductor memory device having the capacitor having a stacked structure (i.e., stacked capacitor) can be prevented.

These organic films, e.g., the first insulation film 6 may be pattern-formed through the following steps: First, a precursor solution is coated to form the first insulation film 6, and the second insulation film 7 comprised of a hard-mask material is formed on the first insulation film 6. Next, an opening-forming resist pattern is formed on the second insulation film 7. Using this resist pattern as a mask, openings are formed in the second insulation film 7. Thereafter, using the resist and the second insulation film 7 as masks, openings are formed in the first insulation film 6 by dry etching making use of a plasma gas composed chiefly of oxygen. Here, the above resists are also removed. The first surface-protective film 9 may also be formed in the same manner as the above.

As a treating method used when the organic films are formed, heating by a hot plate is desirable. The use of a hot plate enables formation of films in a shorter heat treatment time than a case in which a furnace such as an oven furnace or a diffusion furnace is used. This makes it possible to lessen the heat history that may be given to the ferroelectric film.

As the hard-mask material for the second insulation film 7 and second surface-protective film 10 each comprised of a hard-maskmaterial which are used in the present invention, usable are, e.g., $TiO_2$, $SiO_2$, $Al_2O_3$, $CrO_2$, TiN, $Ta_2O_5$, lead titanate zirconate [$Pb(Zr,Ti)O_3$; abbreviation: PZT], barium strontium titanate [$(Ba,Sr)TiO_3$; abbreviation: BST], niobium strontium bismuth tantalate [$SrBi_2(Nb,Ta)_2O_9$; abbreviation: Y1 system], $SrBi_2Ta_2O_9$, $ZrO_2$, $ZrSiO_4$, $HfO_2$, $Y_2O_3$, $BaTiO_3$, $La_2O_3$, $Gd_2O_3$ and $PrO_2$. These materials may be formed into films by chemical vapor deposition (CVD), sol-gel processing, sputtering or the like.

The second insulation film 7 and second surface-protective film 10 each comprised of the above hard-mask material are films having a high reactivity with hydrogen like oxide films, and incorporate any existing hydrogen positively in the films to chemically prevent the hydrogen from entering the capacitor. Also, the hydrogen contained in the first surface-protective film 9 is on the order of $10^{16}$ at the initial stage when measured by the same method as that for the measurement of the adsorption of water which was described above. However, such hydrogen is consumed as a result of the reaction with the hard-mask material, and decreases to about $\frac{1}{10}$ of that at the initial stage. As the result, these films chemically prevent the hydrogen from entering the ferroelectric film (capacitor), and can prevent the hydrogen from reducing and deteriorating the ferroelectric film.

The non-volatile ferroelectric memory device as described above is packaged by package mounting such as resin packaging, CPS (chip-size packaging or chip-scale packaging), bare-chip mounting or IC card packaging and is used in the field of consumer machinery. Also, by using the above multilayered film as the outermost surface passivation film, a barrier effect against the hydrogen and water coming from the resin packaging can be expected, and a high reliability is obtained also in resin-encapsulated semiconductor devices.

The present invention is described below in greater detail by giving specific examples and with reference to the accompanying drawings.

EXAMPLE 1

Figure 3:
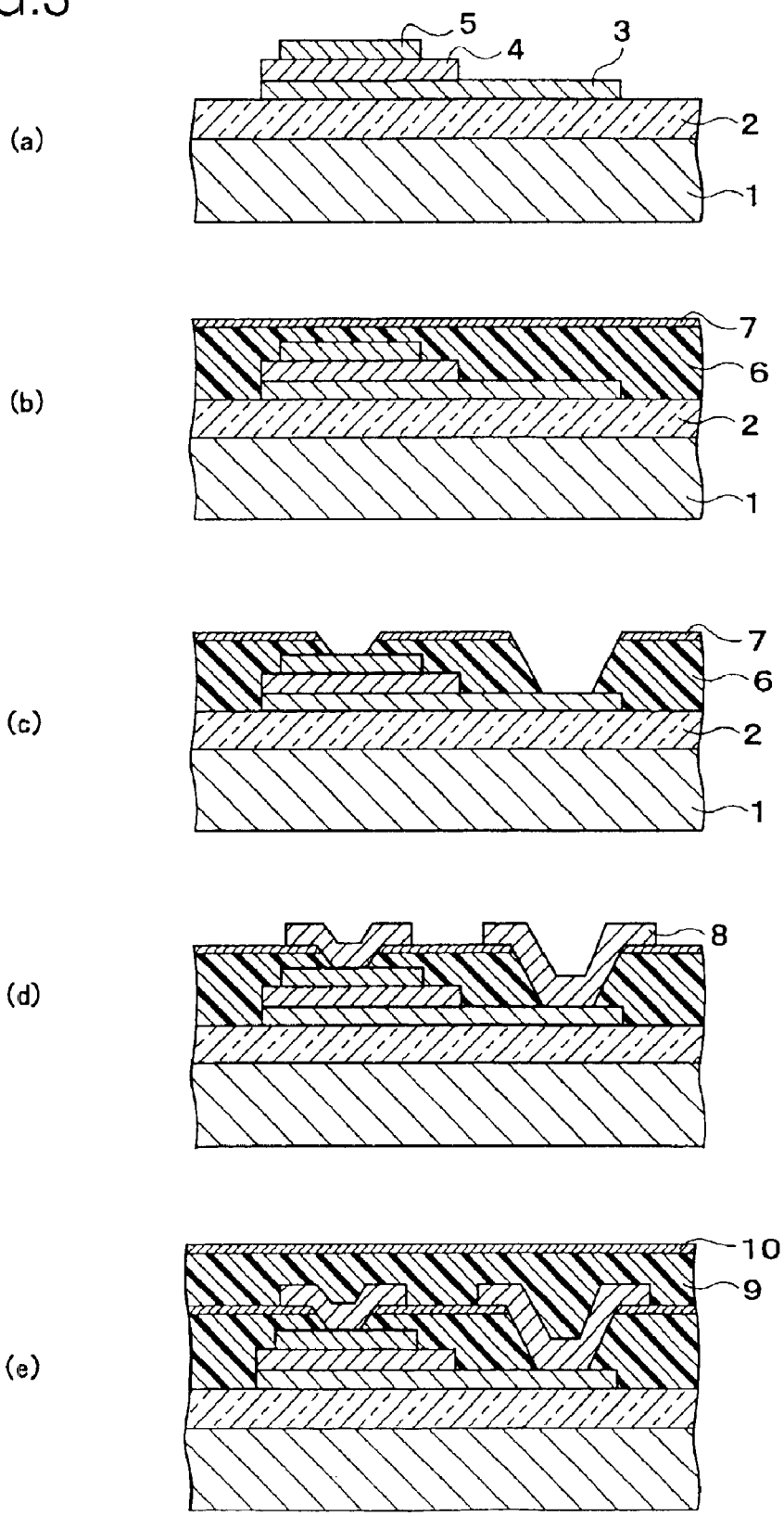
FIG. 3 is a flow sheet for describing a semiconductor memory device manufacturing process carried out in Example 1.

Example 1 is described with reference to the FIG. 3 flow sheet. A semiconductor wafer member is prepared which has a semiconductor substrate 1 on which transistors (not shown) have been fabricated, an interlayer insulation film 2 formed at the upper part thereof, and formed thereon a capacitor layer consisting of a lower electrode 3, a capacitive insulation film (ferroelectric layer) 4 and an upper electrode 5 (Step a).

On this wafer member, an organic insulation film material SILK (trademark; available from Dow Chemical) is coated by means of a spinner, a well known means, followed by heat treatment subsequently on hot plates of 180° C. and 320° C. for 1 minute each, and further followed by heat curing on a 430° C. hot plate for 10 minutes in a stream of nitrogen to form a first insulation film 6 (layer thickness: 400 nm). Next, on the first insulation film 6 thus formed, a $TiO_2$ film (layer thickness: 50 nm) is vacuum-deposited as a second insulation film 7 by reactive sputtering at normal temperature (Step b).

Next, on the second insulation film 7, a positive photoresist OFPR800, available from Tokyo Ohka Kogyo Co., Ltd., is spin-coated, followed by heating at 90° C. for 1 minute by means of a hot-plate heater. The photoresist coating formed is exposed via a photomask, and then the exposed areas are developed with an aqueous alkali developer for positive resists, and thereafter openings are formed through which the second insulation film 7 is uncovered, followed by heating at 160° C. for 1 minute by means of a hot-plate heater.

Next, using a $Cl_2/C_2F_6/Ar$ mixed gas and using a resist pattern as a mask, the second insulation film 7 is patterned. Thereafter, using the resist pattern and the second insulation film 7 as masks, openings are successively formed in the first insulation film 6 using $O_2$ plasma gas. At this stage, the resist pattern is simultaneously removed, but the second insulation film 7 is not corroded (Step c).

Next, a top wiring layer 8 comprised of Al is formed, followed by etching using as a mask a resist pattern formed thereon, to form an Al wiring pattern (Step d).

Next, a polyimide solution PIQ3200-7H, product name, available from Hitachi Chemical Co., Ltd., is spin-coated, followed by heating at 140° C. for 1 minute by means of a hot-plate heater in an atmosphere of nitrogen, further followed by heating at 230° C. for 4 minutes and at 350° C. for 8 minutes to imidize the polyimide precursor to form a first surface-protective film 9, which covers the surface of the wiring layers. Here, the first surface-protective film 9 is in a thickness of 1,200 nm.

Next, on the first surface-protective film 9, a lead titanate zirconate [$Pb(Zr,Ti)O_3$; abbreviation: PZT] film is formed by sol-gel processing. More specifically, a starting PZT solution is coated by means of a spinner, a well known means, followed by heating subsequently on hot plates of 150° C. and 400° C. for 3 minutes each to form a second surface-protective film 10. Here, the second surface-protective film 10 is in a thickness of 200 nm (Step e).

Not shown in the drawing, on the second surface-protective film 10, a positive photoresist OFPR800, available from Tokyo Ohka Kogyo Co., Ltd., is spin-coated, followed by heating at 90° C. for 1 minute by means of a hot-plate heater. Next, the photoresist coating formed is exposed via a photomask, and then the exposed areas are developed with an aqueous alkali developer for positive resists, and openings are formed through which the second surface-protective film 10 is uncovered, followed by heating at 160° C. for 1 minute by means of a hot-plate heater.

Next, using a $Cl_2/C_2F_6/Ar$ mixed gas and using a resist pattern as a mask, the second surface-protective film 10 is patterned. Subsequently, using the resist pattern and the second surface-protective film 10 as masks, openings are formed in the first surface-protective film 9 at its device pad portions, using $O_2$ plasma gas, so as to be able to make conduction to the outside. At this stage, the resist pattern is simultaneously removed.

Through the steps carried out as described above, a non-volatile ferroelectric memory device was obtainable in which the multilayered film consisting of an organic film and a hard-mask material film was used in i) the interlayer insulation film formed between the capacitor layer making use of a ferroelectric film and the wiring layer formed at the upper part of the capacitor and ii) the insulation film which covers the wiring layer.

The above memory device was heated at 150° C., in the course of which the retention characteristics, one of electric properties of the ferroelectric film, were measured. As the result, electric charges retained in the capacitor layer were found to have been kept to lower by about ⅓ at most compared with those at the initial condition even after heating for 100 hours, and have retained the value of about 5 $\mu C/cm^2$. From the results of such an accelerated test, it was found that a highly reliable memory device was obtainable which could assure the characteristics as a ferroelectric memory device for 10 years or more in a usual service environment.

EXAMPLE 2

Figure 4:
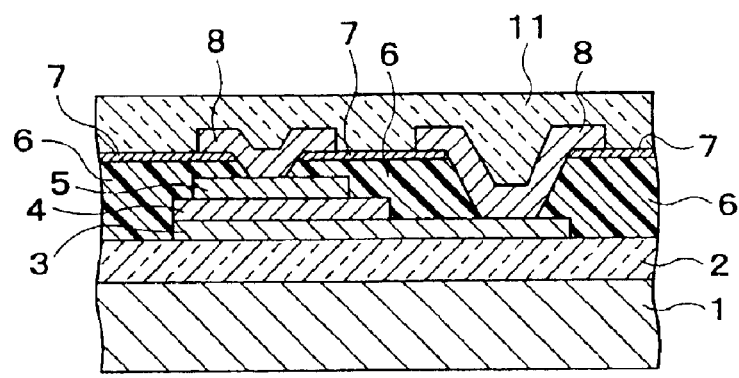
FIG. 4 is a sectional view for describing a semiconductor memory device produced in Example 2.

An example of a semiconductor memory device in which the multilayered film consisting of an organic film and a hard-mask material film is used in an interlayer insulation film formed between a capacitor layer making use of a ferroelectric film and a wiring layer formed at the upper part of the capacitor is cross-sectionally shown in FIG. 4.

On the same semiconductor device wafer member as that used in Example 1, an organic insulation film material FLARE (trademark; available from Honeywell) is spin-coated, followed by heat treatment subsequently on hot plates of, e.g., 150° C., 200° C. and 250° C. for 1 minute each. The coating film thus formed is subjected to heat curing on a 425° C. hot plate for 10 minutes in an atmosphere of nitrogen to form a first insulation film 6. Here, the first insulation film 6 is in a thickness of 500 nm.

Next, on the first insulation film 6 thus formed, a lead titanate zirconate [$Pb(Zr,Ti)O_3$; abbreviation: PZT] film is formed by sol-gel processing. More specifically, a starting PZT solution is coated by means of a spinner, a well known means, followed by heating subsequently on hot plates of 150° C. and 400° C. for 3 minutes each to form a second insulation film 7. Here, the second insulation film 7 comprised of PZT is in a thickness of 100 nm.

Next, on the second insulation film 7, a positive photoresist TDUR P036, available from Tokyo Ohka Kogyo Co., Ltd., is spin-coated, followed by heating for 1.5 minutes on a 80° C. hot-plate. Thereafter, the photoresist coating formed is exposed by means of a known KrF laser stepper, followed by development with PED•NMD 3 (available from Tokyo Ohka Kogyo Co., Ltd.) to form a resist pattern.

Next, using a commonly available dry etching system, e.g., Unity 2-85DL (available from Tokyo Electron Limited), and also using a $Cl_2/C_2F_6/Ar$ mixed gas, the second insulation film 7 is patterned using the resist pattern as a mask,.

Then, using the resist pattern and the patterned second insulation film 7 as masks, openings are formed in the first insulation film 6 using $O_2$ plasma gas. At this stage, the resist pattern is simultaneously etched away, but the second insulation film 7 is not corroded by the $O_2$ plasma gas.

Next, an upper Al wiring layer is formed, followed by etching using a resist pattern as a mask, to form an Al wiring pattern top wiring layer 8.

Then, as a moisture-resistant protective film 11 which covers device portions inclusive of the above top wiring layer 8, an SiON film of 1,000 nm in layer thickness is formed by plasma-assisted CVD carried out at a substrate temperature of 300° C. by means of a parallel-plate reactor using $SiH_3$, $NH_3$ and $N_2O$ as source gases. Also, here, openings are formed at device pad portions so as to be able to make conduction to the outside.

Through the steps carried out as described above, a non-volatile ferroelectric memory device was obtainable in which the multilayered film consisting of an organic film and a hard-mask material film was used in the interlayer insulation film formed between the capacitor layer making use of a ferroelectric film and the wiring layer formed at the upper part of the capacitor.

This memory device was put to the same accelerated test as the case of Example 1. As the result, electric charges retained in the capacitor layer were found to have been kept at ⅓ or more of the initial value at the stage of the lapse of 100 hours and have retained the value of about 5 $\mu C/cm^2$.

COMPARATIVE EXAMPLE

First, a semiconductor wafer on which transistors, an interlayer insulation film 2 formed at the upper part thereof and a capacitor layer consisting of a lower electrode, a ferroelectric layer and an upper electrode have been formed is prepared. On the wafer member thus prepared, an insulation film is formed from TEOS (tetraethyl orthosilicate) plasma by plasma-assisted CVD. Here, the film is formed at a temperature of 450° C.

Next, on the insulation film, a positive photoresist OFPR800, available from Tokyo Ohka Kogyo Co., Ltd., is spin-coated, followed by heating at 90° C. for 1 minute by means of a hot-plate heater. The photoresist coating formed is exposed via a photomask, and then the exposed areas are developed with an aqueous alkali developer for positive resists, and openings are formed through which the underlying TEOS film has been uncovered.

Next, openings are formed in the TEOS film by dry etching, and then the resist film was removed. Thereafter, an upper-part Al wiring layer is formed, and then the resist pattern was masked, followed by etching of the Al wiring layer to form an Al wiring pattern.

Next, using a $SiH_4/NH_3/H_2$ mixed gas plasma, a silicon nitride film is so formed as to cover the whole surface of the Al wiring layer. Here, this film is formed at a temperature of 450° C. Also, here, openings are formed at device pad portions so as to be able to make conduction to the outside.

Through the steps described above, a semiconductor memory device was obtained in which i) the interlayer insulation film formed between the capacitor layer making use of a ferroelectric film and the wiring layer formed at the upper part of the capacitor or ii) the insulation film which covers the wiring layer was formed of an inorganic film by plasma-assisted CVD.

This semiconductor memory device was put to the same accelerated test as the case of Example 1. As the result, electric charges retained in the capacitor layer were found to have lowered to 1/10 or less of the initial value at the stage of the lapse of 100 hours (1 $\mu C/cm^2$ or less). This result shows that the capacitor characteristics deteriorate remarkably, compared with the case of Example 1, and indicates that the device is not in the state it is durable to its practical use.

EXAMPLE 3

Figure 5:
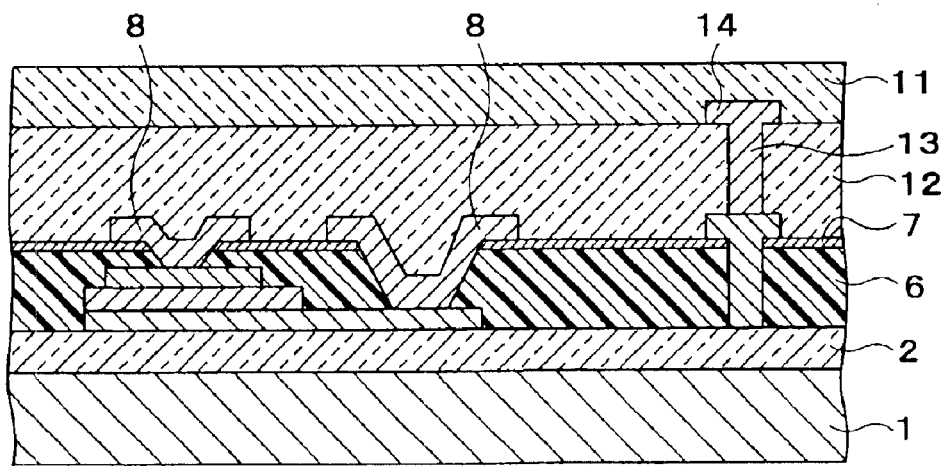
FIG. 5 is a sectional view for describing an example of the construction of a semiconductor memory where a second wiring is used in the region of a peripheral circuit.

As a third embodiment of the present invention, a semiconductor memory device in which a second wiring is used in the region of a peripheral circuit is cross-sectionally shown in FIG. 5.

In the same manner as in Example 1, on a semiconductor wafer on which transistors, an interlayer insulation film 2 formed at the upper part thereof and a capacitor layer consisting of a lower electrode, a ferroelectric layer and an upper electrode have been formed, a first insulation film 6 and a second insulation film 7 are successively formed, and thereafter the second insulation film 7 is patterned. Subsequently, openings are formed in the first insulation film 6. Then, an upper Al wiring layer 8 formed thereon is subjected to etching to form an Al wiring pattern.

Next, as an interlayer insulation film, an $SiO_2$ film 12 (layer thickness: 400 nm) is deposited by $O_3$-TEOS CVD. Thereafter, through-holes for forming the wiring of the peripheral circuit are formed using a photoresist as a mask, by RIE (reactive ion etching) using $CF_4$ as an etching gas. Thereafter, a tungsten plug 13 is formed, and then an upper Al wiring layer is formed, followed by etching using a resist as a mask, to form an Al wiring pattern 14.

Next, a moisture-resistant protective film 11 is formed in the same manner as in Example 2, and openings are formed at device pad portions so as to be able to make conduction to the outside.

Figure 6:
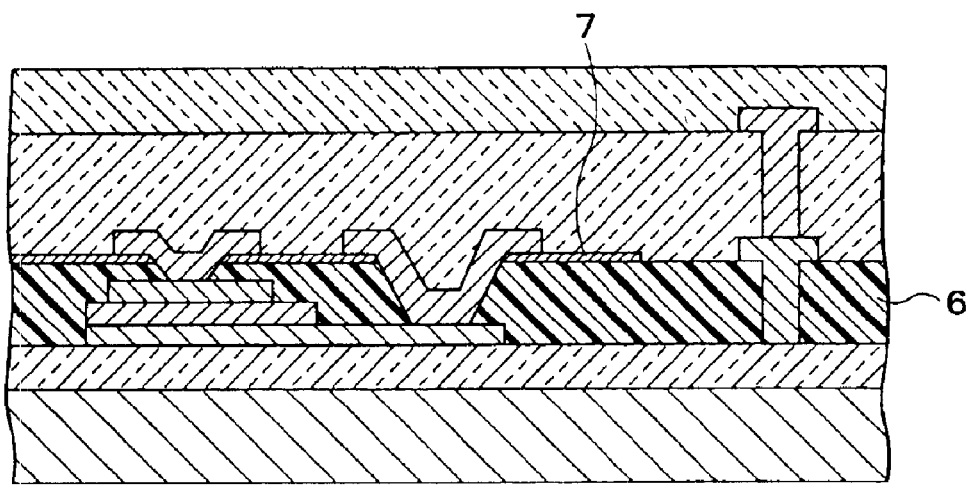
FIG. 6 is a sectional view for describing a semiconductor memory device produced in Example 3.
Figure 7:
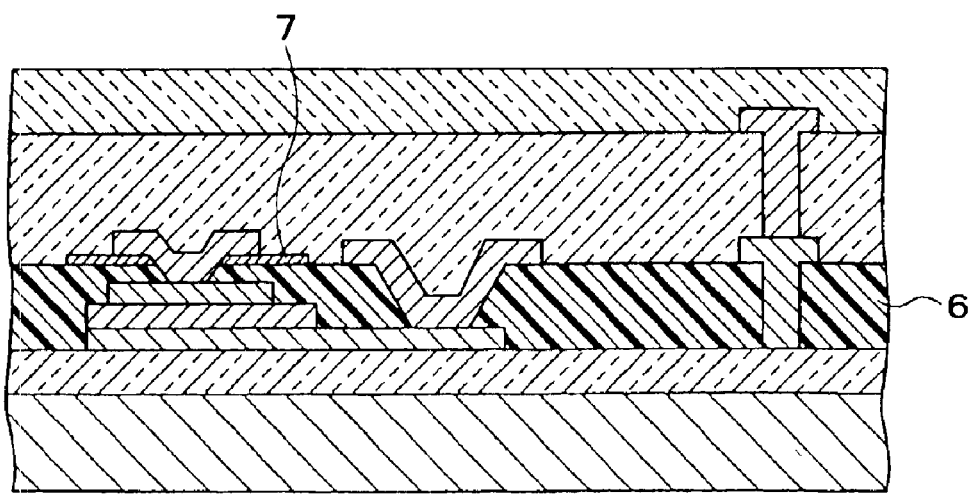
FIG. 7 is a sectional view for describing a semiconductor memory device produced in Example 3.

Through the steps carried out as described above, a non-volatile ferroelectric memory device was obtainable in which the multilayered film consisting of an organic film and a hard-mask material film was used in the interlayer insulation film formed between the capacitor layer making use of a ferroelectric film and the wiring layer formed at the upper part of the capacitor. Also, since the second insulation film 7 is present at least in the region of a memory cell array, the device may also be constructed as shown in FIG. 6 or 7.

The above memory device was put to the same accelerated test as the case of Example 1. As the result, electric charges retained in the capacitor layer were found to be about 5 $\mu C/cm^2$ after the lapse of 100 hours and have retained the value of ⅓ or more of the initial value. From this result, the memory device in Example 3 was found to have a reliability high enough to be well durable to its practical use.

EXAMPLE 4

Figure 8:
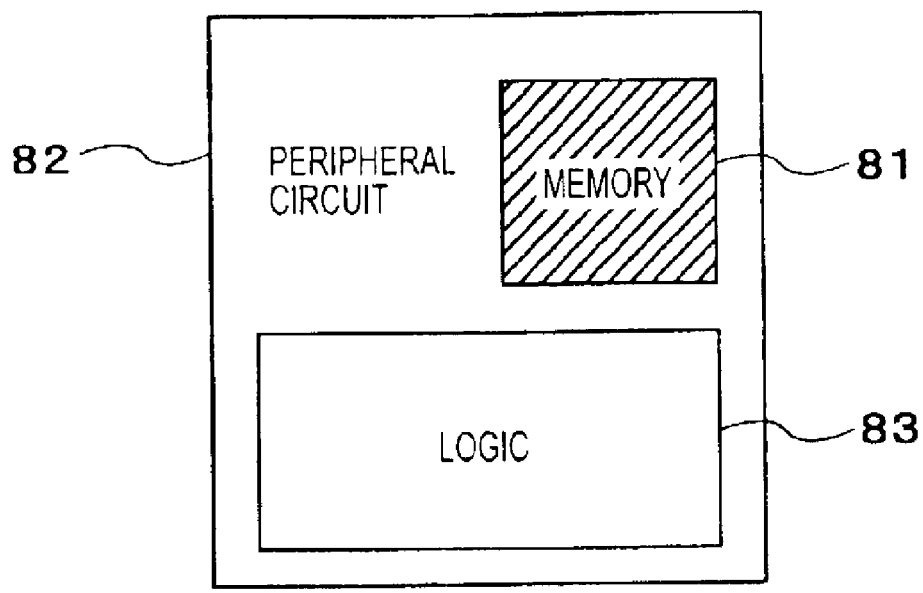
FIG. 8 is a diagrammatic view showing an example of a chip layout in a case in which a memory and a logic are mounted together.

As exemplified in Example 3, a ferroelectric memory and a logic circuit such as CPU can mixedly be mounted in the same chip when two- or more-layer wiring is used. An example of a chip layout where a logic circuit is mixedly mounted is shown in FIG. 8. As shown in FIG. 8, a ferroelectric memory cell array region 81, a peripheral circuit region 82 for controlling this and a logic circuit region 83 are laid out in one chip.

Figure 9:
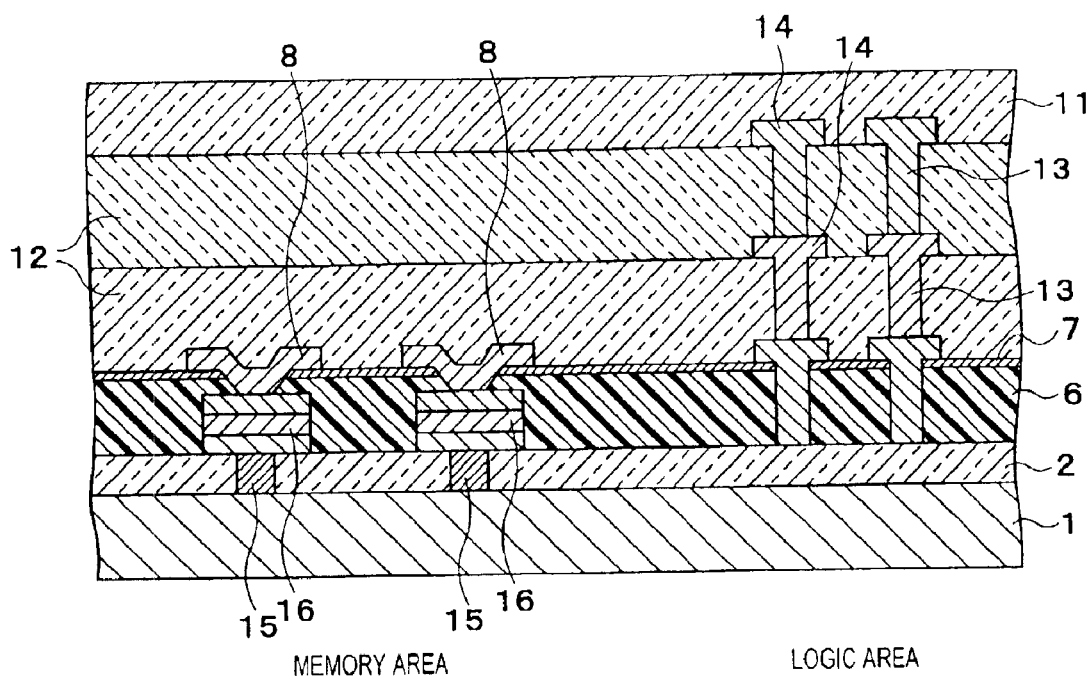
FIG. 9 is a sectional view for describing a semiconductor device in which a memory and a logic are mounted together.
Figure 10:
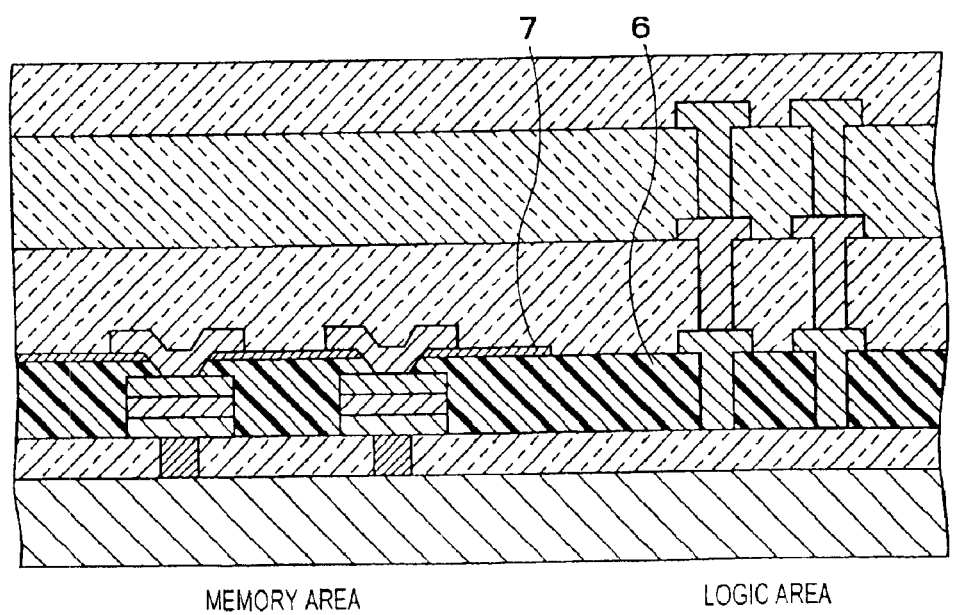
FIG. 10 is a sectional view for describing a semiconductor device in which a memory and a logic are mounted together, produced in Example 4.
Figure 11:
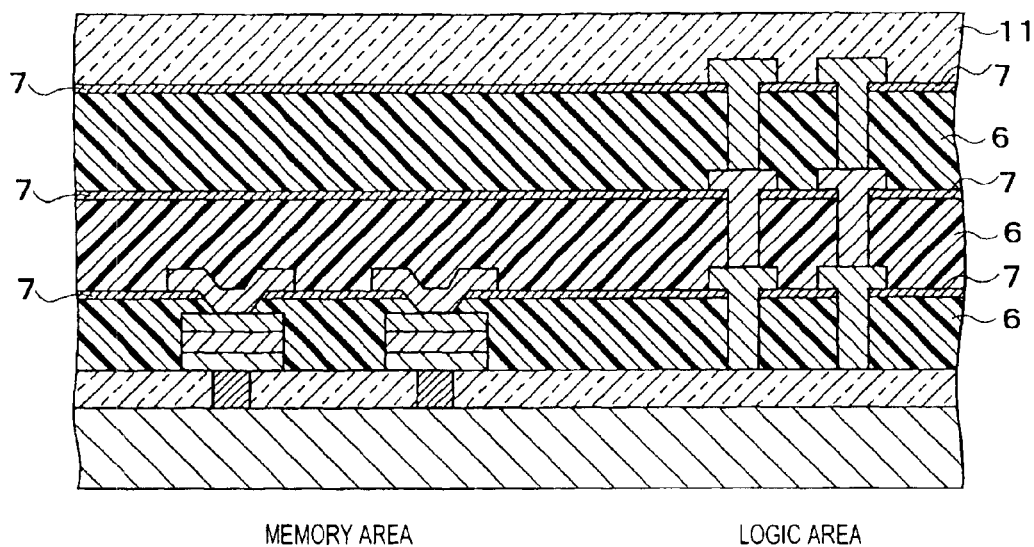
FIG. 11 is a sectional view for describing a semiconductor device in which a memory and a logic are mounted together, according to an embodiment in Example 4.
Figure 12:
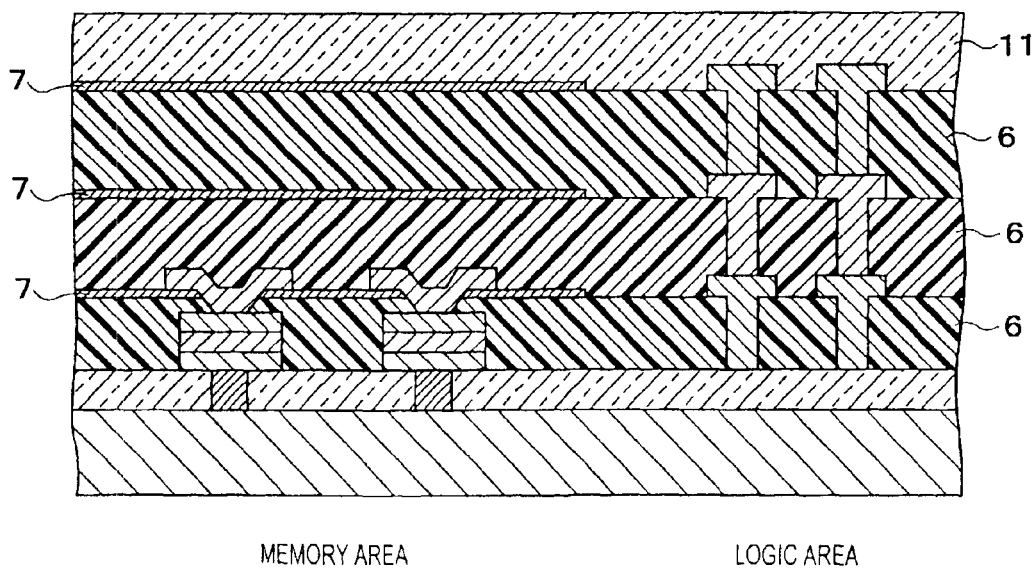
FIG. 12 is a sectional view for describing a semiconductor device in which a memory and a logic are mounted together, according to another embodiment in Example 4.
Figure 13:
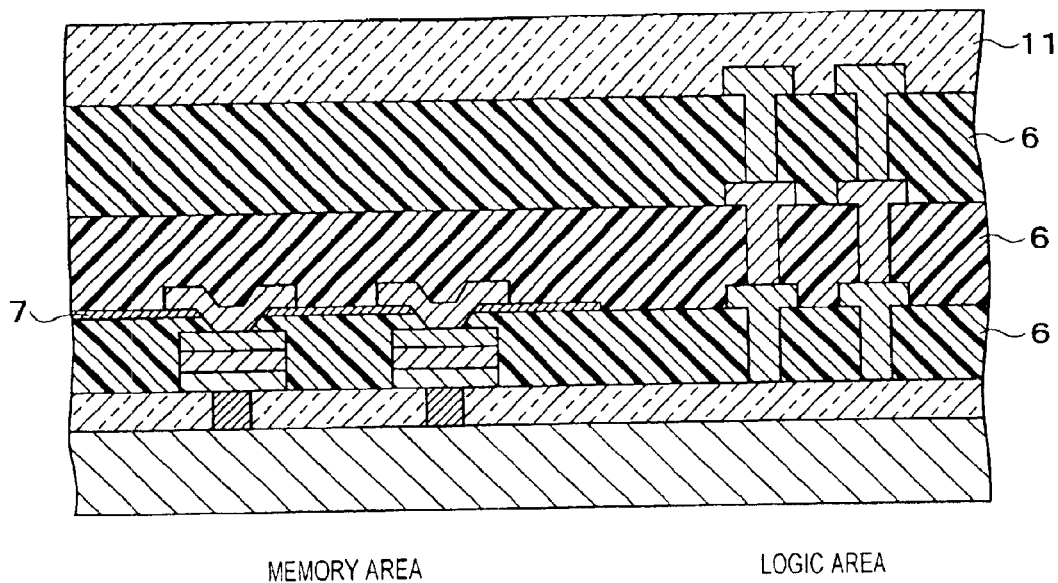
FIG. 13 is a sectional view for describing a semiconductor device in which a memory and a logic are mounted together, according to still another embodiment in Example 4.

Using a semiconductor substrate on which a memory area and a logic area have been laid out as shown in FIG. 9 or 10, a mixedly mounted memory device is formed through the same steps as those in Example 3 in respect of the step of forming the first insulation film and the subsequent steps. In FIG. 9, reference numeral 15 denotes plugs; and 16, capacitors in which thin films of a dielectric material having a high dielectric constant or of a ferroelectric material are used as capacitive insulation films. Here, as shown in FIG. 11, the steps of forming the first insulation film 6 and second insulation film 7 may be repeated so that all the layers of the interlayer insulation films are each the multilayered film consisting of the first insulation film formed of an organic film and the second insulation film formed of a hard-mask material. Also, since the second insulation film 7 is present in the memory cell array region, the interlayer insulation films may be constructed as shown in FIG. 12 or 13.

The above mixedly mounted memory device (FIG. 9 or 10) was put to the accelerated test. As the result, substantially the same reliability data as those in Examples 1 to 3 were obtainable.

EXAMPLE 5

Figure 14:
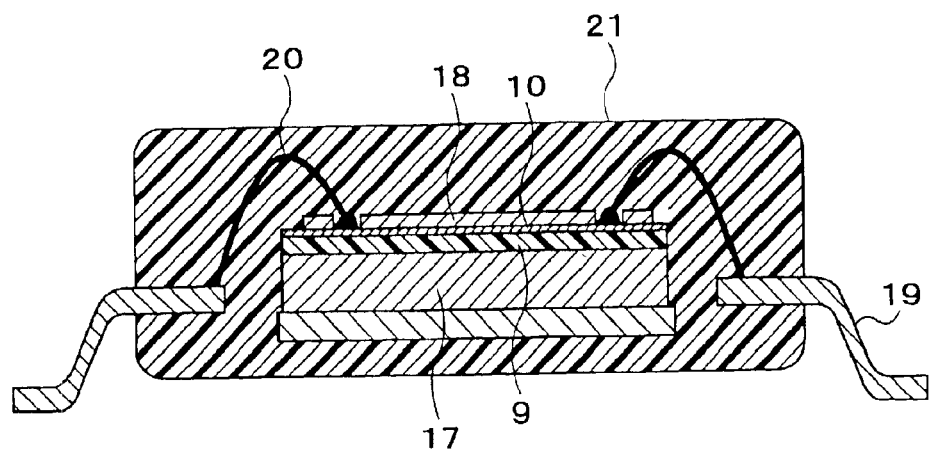
FIG. 14 is a sectional view for describing a resin-encapsulated semiconductor memory device.

A resin-encapsulated semiconductor memory device is cross-sectionally shown in FIG. 14. A wafer on which a non-volatile ferroelectric memory device 17 obtained in the same manner as in Example 1 has been fabricated, in which the multilayered film consisting of an organic film and a hard-mask material film is used in i) the interlayer insulation film formed between the capacitor layer making use of a ferroelectric film and the wiring layer formed at the upper part of the capacitor or ii) the insulation film which covers the wiring layer, is cut at the scribing region, and thereafter a surface-protective film 18 is so formed as to cover the memory device to form a semiconductor memory device. In FIG. 14, reference numerals 9 and 10 denote the same ones as those shown in FIG. 2 and others.

This semiconductor memory device is fixed to a lead frame in a die bonding step provided separately. Thereafter, bonding pad portions of the semiconductor memory device and external terminals 19 of the lead frame are connected by wiring with gold wires 20 by means of a wire bonder.

Next, using a silica-containing biphenyl epoxy resin available from Hitachi Chemical Co., Ltd., and at a molding temperature of 180° C. and a molding pressure of 70 kg/cm$^2$, a resin-encapsulated part 21 is so formed as to cover the whole semiconductor memory device inclusive of the external terminals of the lead frame. Finally, the external terminals 19 are bent in a prescribed form to obtain a finished product, resin-encapsulated semiconductor memory device 21.

Needless to say, as characteristics of the semiconductor memory device thus obtained, it has the same effect as the case stated in Example 1. In addition, since the memory device is resin-encapsulated, it can exhibit stabler characteristics against any external environment than those in the case of Examples 1 to 3.

EXAMPLE 6

Figure 15:
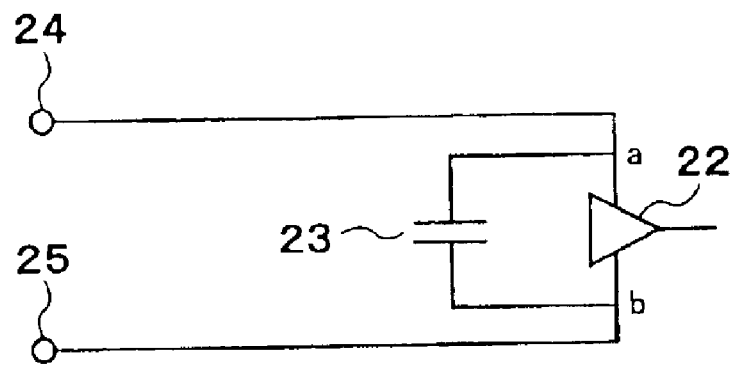
FIG. 15 is an equivalent circuit showing a switching circuit making use of a by-pass capacitor.

An example in which the present invention is applied in a by-pass capacitor is explained below. FIG. 15 shows a basic equivalent circuit of a switching circuit having a by-pass capacitor. Electric current generated upon the switching of an IC 22 and flowing between a power source 24 and a ground 25 is fed from a by-pass capacitor 23. In order to minimize the noise level between the power source 24 and the ground 25, what is required for the by-pass capacitor 23 is in the first place its disposition.

Between a and b shown in FIG. 15, a large value is present as resistance or inductance. Hence, the function as the by-pass capacitor may lower with an increase in this resistance or inductance. Accordingly, it is necessary for the by-pass capacitor to be disposed at a position close to the IC 22 as far as possible and also for the capacitor's electrode to be so shaped as not to make the inductance large.

The capacitance of the by-pass capacitor is also a factor on which the noise level depends. Accordingly, in general, the smaller any required noise level is and the higher the frequency band used is, the larger capacitance characteristics is required as the by-pass capacitor.

Figure 16:
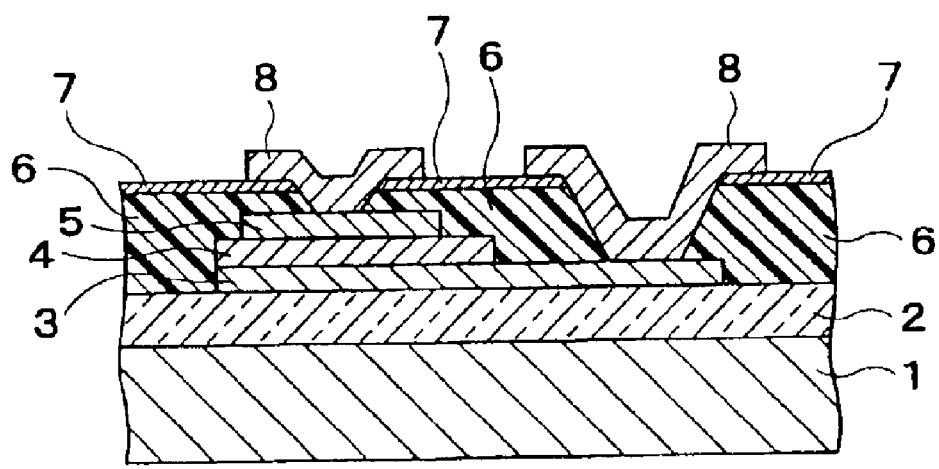
FIG. 16 is a diagrammatic view showing an example in which the present invention is applied in a by-pass capacitor.

FIG. 16 is a diagrammatic view showing the example in which the present invention is applied in the by-pass capacitor. One of electrodes sandwiching a capacitive insulation film 4 is formed as a power source electrode and the other as a ground electrode. These electrodes must be so shaped as not to make the inductance large as stated above.

In this Example, too, like other Examples, the interlayer insulation film of the capacitor is made to comprise the multilayered film consisting of the first insulation film formed of an organic film and the second insulation film formed of a hard-mask material. This can keep any unnecessary capacitance from increasing and also prevent deterioration of the capacitive insulation film comprising the thin film of a dielectric material having a high dielectric constant or of a ferroelectric material. Thus, a by-pass capacitor having a high reliability can be obtained.

The present invention has been described above in detail by giving Examples. Conditions and so forth for achieving the present invention and these Examples are by no means limited to those in these Examples.

As described above, according to the present invention, in the semiconductor memory device having the capacitive insulation film in which the dielectric material having a high dielectric constant or the ferroelectric material is used, the ferroelectric film can be prevented from any deterioration caused by the hydrogen and water contained in the interlayer insulation film and passivation film of the device and by the stress of these films.

While we have shown and described several embodiments in accordance with our invention, it should be understood that disclosed embodiments are susceptible of changes and modifications without departing from the scope of the invention. Therefore, we do not intend to be bound by the details shown and described herein but intend to cover all such changes and modifications a fall within the ambit of the appended claims.

What is claimed is:

1. A semiconductor memory device having a capacitor in which a thin film of a dielectric material having a high dielectric constant or of a ferroelectric material is used as a capacitive insulation film, wherein an interlayer insulation film formed between the capacitor and a wiring layer formed at the upper part thereof comprises a multilayered film consisting of a first insulation film and a second insulation film laid upon the other; said first insulation film being a lower layer and being formed of a film containing an organic matter, so as to cover a memory region including at least said capacitor and to be in contact with said capacitive insulation film, and said second insulation film being an upper layer and being formed of a hard-mask material having barrier properties to hydrogen, and an electrode of said wiring layer is connected to said capacitor through openings formed by running through said first insulation film and said second insulation film.

2. The semiconductor memory device according to claim 1, wherein the relative dielectric constant of said first insulation film is less than 4.0, and is smaller than the relative dielectric constant of said second insulation film.

3. The semiconductor memory device according to claim 1, wherein said second insulation film contains at least one of $SiO_2$, $Al_2O_3$, $CrO_2$, TiN, lead titanate zirconate, barium strontium titanate, niobium strontium bismuth tantalate, $SrBi_2Ta_2O_9$, $ZrSiO_4$, $Y_2O_3$, $BaTiO_3$, $La_2O_3$, $Gd_2O_3$, and $PrO_2$.

4. The semiconductor memory device according to claim 1, wherein said second insulation film is so disposed as to cover a memory region including at least said capacitor.

5. A semiconductor memory device manufacturing process comprising the steps of:

forming a first insulation film comprised of an organic insulation film material, on a semiconductor substrate having thereon a capacitor in which a thin film of a dielectric material having a high dielectric constant or of a ferroelectric material is used as a capacitive insulation film, said first insulation film being formed so as to cover a memory region including at least said capacitor and to be in contact with said capacitive insulation film;

forming on the first insulation film a second insulation film comprised of a hard-mask material having barrier properties to hydrogen;

forming openings in said second insulation film by using a resist pattern which is located on the second insulation film as a mask;

forming openings in said first insulation film by using said resist pattern and said second insulation film as masks; and forming a wiring layer to connect an electrode of said capacitor to said wiring layer through openings running through said first insulation film and said second insulation film.

6. The semiconductor memory device manufacturing process according to claim 5, wherein the step of forming said first insulation film is the step of forming an organic insulation film having a relative dielectric constant of less than 4.0 and is smaller than the relative dielectric constant of said second insulation film.

7. The semiconductor memory device manufacturing process according to claim 5, wherein the step of forming said second insulation film is the step of forming on said first insulation film an insulation film containing at least one of $SiO_2$, $Al_2O_3$, $CrO_2$, TiN, lead titanate zirconate, barium strontium titanate, niobium strontium bismuth tantalate, $SrBi_2Ta_2\ O_9$, $ZrSiO_4$, $Y_2O_3$, $BaTiO_3$, $La_2O_3$, $Gd_2O_3$, and $PrO_2$.

* * * * *